United States Patent [19]

Chen et al.

[11] Patent Number: 5,595,925

[45] Date of Patent: Jan. 21, 1997

[54] METHOD FOR FABRICATING A MULTIPLE WELL STRUCTURE FOR PROVIDING MULTIPLE SUBSTRATE BIAS FOR DRAM DEVICE FORMED THEREIN

[75] Inventors: Ih-Chin Chen, Richardson; Hisashi Shichijo; Clarence W. Teng, both of Plano, all of Tex.

[73] Assignee: Texas Instruments Incorporated, Dallas, Tex.

[21] Appl. No.: 236,745

[22] Filed: Apr. 29, 1994

[51] Int. Cl.⁶ ............................ H01L 21/70; H01L 27/00
[52] U.S. Cl. ............................ 437/52; 437/47; 437/60; 437/919
[58] Field of Search ............................ 437/52, 919, 47, 437/60; 257/299, 901

[56] References Cited

U.S. PATENT DOCUMENTS

| | | | |
|---|---|---|---|
| 3,916,430 | 10/1975 | Heuner et al. | 257/299 |
| 5,260,226 | 11/1993 | Sawada | 437/52 |
| 5,281,842 | 1/1994 | Yasuda et al. | 257/296 |
| 5,293,055 | 3/1994 | Hara et al. | 257/301 |
| 5,324,982 | 6/1994 | Nakazato et al. | 257/546 |
| 5,348,905 | 9/1994 | Kenney | 437/919 |

OTHER PUBLICATIONS

Syuso Fujii, et al., "Session 16: Dynamic RAMs FAM 16.6: A 45ns 16Mb DRAM with Triple-Well Structure", IEEE, 1989, pp. 248–249.

S. Yoshikawa, et al., "Process Technologies for a High Speed 16MDRAM with Trench Type Cell", Semiconductor Device Engineering Laboratory, Toshiba Corp., pp. 67–68 (date unknown).

*Primary Examiner*—George Fourson
*Assistant Examiner*—H. Jey Tsai
*Attorney, Agent, or Firm*—John D. Crane; James C. Kesterson; Richard L. Donaldson

[57] ABSTRACT

A dynamic random access memory device (10) includes three separate sections—an input/output section (12), a peripheral transistor section (14), and a memory array section (16), all formed on a p- type substrate layer (18). The dynamic random access memory device (10) can employ separate substrate bias voltages for each section. The input/output section (12) has a p- type region (22) that is isolated from the p- type substrate layer (18) by an n-type well region (20). The peripheral transistor section (14) has a p- type region (36) that can be isolated from the p- type substrate layer (18) by an optional n- type well region (40) for those devices which require a different substrate bias voltage between the peripheral transistor section (14) and the memory array section (16).

4 Claims, 1 Drawing Sheet

METHOD FOR FABRICATING A MULTIPLE WELL STRUCTURE FOR PROVIDING MULTIPLE SUBSTRATE BIAS FOR DRAM DEVICE FORMED THEREIN

TECHNICAL FIELD OF THE INVENTION

The present invention relates in general to semiconductor fabrication processes and devices and more particularly to an apparatus and method of fabricating a multiple substrate bias dynamic random access memory device.

BACKGROUND OF THE INVENTION

Dynamic random access memory (DRAM) devices have traditionally employed a substrate bias voltage on the N-channel transistors to improve latch up immunity, cell isolation, and circuit speed. However, for submicron devices, the substrate bias enhances an undesirable short channel effect. This short channel effect produces a large threshold voltage difference between devices of different sizes when the substrate bias voltage is applied. Such a large difference between devices of different sizes make the control of the threshold voltage very difficult.

Attempts to overcome this short channel effect problem include using triple well isolation to allow for different substrate biases to be applied to different parts of the dynamic random access memory. However, the triple well approach uses an unconventional n- type substrate and isolation with various p- type wells. Further, the depth of the p- type wells limit the depth for a trench in the memory array of the DRAM device. Since the trench wall is doped with an N+ conductivity type, any contact of the trench with the n-type substrate will short the trenches together. Therefore, it is desirable to overcome the short channel effect and trench depth problems through a more conventional process.

SUMMARY OF THE INVENTION

From the foregoing, it may be appreciated that a need has arisen for a dynamic random access memory device that operates on multiple substrate bias voltages in order to overcome the short channel effect. A need has also arisen for a dynamic random access memory device that overcomes the short channel effect through conventional processes.

In accordance with the present invention, an apparatus and method of fabricating a multiple substrate bias dynamic random access memory device are provided which substantially eliminate or reduce disadvantages and problems associated with other processes attempting to overcome the short channel effect.

According to an embodiment of the present invention, there is provided a method of fabricating a multiple substrate bias dynamic random access memory device that includes forming an input/output section within a p- type substrate layer where the input/output section operates from a first substrate bias voltage. A peripheral transistor section is formed within the p- type substrate layer such that the peripheral transistor section can operate from a second substrate bias voltage. A memory array section is formed within the p- type substrate layer such that the memory array section can operate from a third substrate bias voltage.

The apparatus and method of the present invention provides various technical advantages over other processes attempting to overcome the short channel effect. For example, one technical advantage is in employing a conventional p- type substrate layer to overcome the short channel effect. Another technical advantage is in overcoming the short channel effect through multiple substrate bias voltage implementation. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
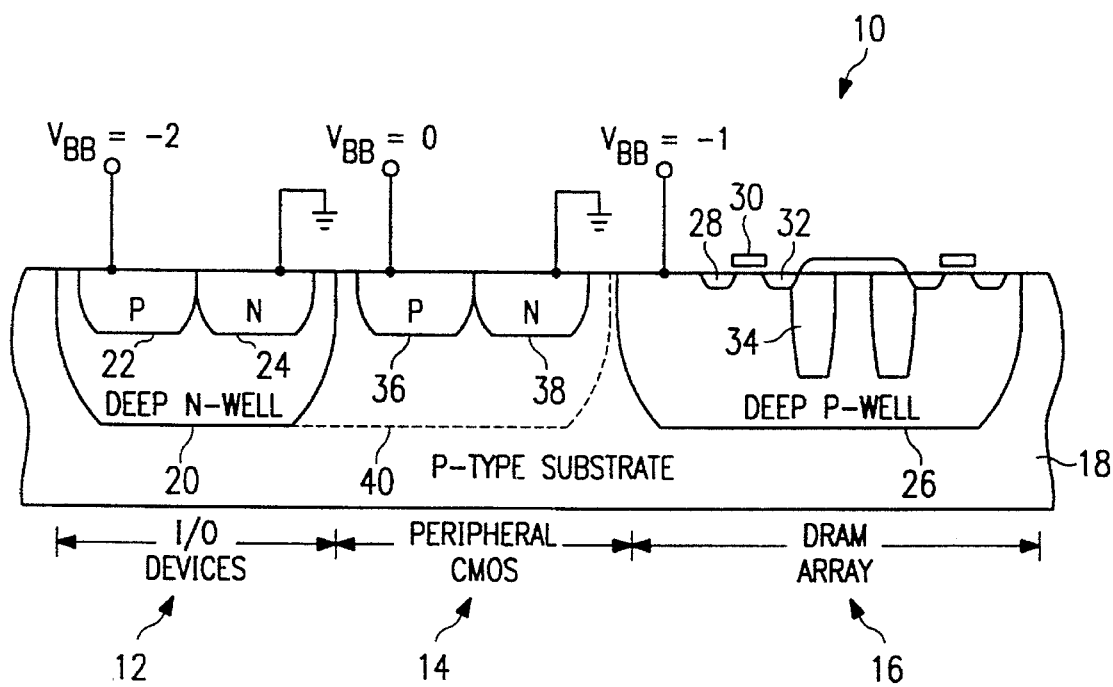
FIG. 1 illustrates a multiple substrate bias dynamic random access memory device.

FIG. 1 shows a dynamic random access memory device 10 which can employ multiple substrate bias voltages. Dynamic random access memory device 10 is made up of at least three distinct sections—an input/output section 12, a peripheral transistor section 14, and a memory array section 16. Each section of dynamic random access memory device 10 can be individually isolated on a p- type substrate layer 18.

Input/output section 12 is made by forming an n- type well region 20 within p- type substrate layer 18. A p- type region 22 and an n- type region 24 are formed within n- type well region 20. n- type well region 20 isolates p- type region 22 from p- type substrate layer 18.

Memory array section 16 is made by forming a p- type well region 26 within p- type substrate layer 18. Multiple subdevices having a source region 28, a gate region 30, and a drain region 32 are formed within p- type well region 26. The multiple subdevices of memory array section 16 are isolated by trenches 34.

Peripheral transistor section 14 is made by forming a p-type region 36 and an n- type region 38 within p- type substrate layer 18. If isolation is required between peripheral transistor section 14 and memory array section 16, an optional n- type well region 40 can be formed prior to forming p- type region 36 and n- type region 38 in order to isolate p- type region 36 from p- type substrate layer 18.

With the formation of n- type well region 40, dynamic random access memory device 10 can operate with three separate substrate bias voltages. In the peripheral transistor section 14, a neutral substrate bias voltage of ground is applied to avoid any back gate biasing of transistors and suppress the short channel effects that result in a larger body effect on the threshold voltage. A different bias voltage may be applied to memory array section 16 in order to improve cell isolation and reduce junction capacitance. Since inter p-type well isolation is achieved by the n- type well region, which can be driven at the same time as the p- type well region 26 of memory array section 16, the need for an n-type substrate for well to well isolation is eliminated. Further, the trench step of trench 34 may be equal to or slightly deeper than p- type well region 26 without significantly increasing cell leakage in order that more capacitor area can be used.

In summary, a dynamic random access memory device can overcome the short channel effect by employing multiple substrate bias voltages through a conventional p- type substrate layer. Each section of the dynamic random access memory device can be individually isolated and trench depth within the memory array section is no longer a critical factor.

Thus, it is apparent that there has been provided in accordance with the present invention, an apparatus and method of fabricating a multiple substrate bias voltage dynamic random access memory device that satisfies the advantages set forth above. Although the preferred embodiment has been described in detail, it should be understood that various changes, substitutions, and alterations can be made herein. For example, process step sequence may be arranged in other ways to achieve the same dynamic random access memory device. Other examples are readily ascertainable by one skilled in the art and could be made without departing from the spirit and scope of the present invention as defined by the following claims.

What is claimed is:

1. A method for fabricating a multiple well structure in which transistors for a dynamic random access memory can be formed, the fabrication method comprising the steps of:

forming a first well structure in a p substrate in which an input/output section can be formed, the first well structure having a deep n well with a shallow p well and a shallow n well formed therein, the shallow p well of said first well structure operating from a first substrate bias voltage;

forming a second well structure in the p substrate in which peripheral transistors can be formed, the second well structure having a shallow p well and a shallow n well formed in the substrate, the shallow p well of said second well structure operating from a second substrate bias voltage;

forming a third well structure in the p substrate in which memory array transistors can be formed, the third well structure having a deep p well formed in the substrate, the p well of said third well structure operating from a third substrate bias voltage; and forming trench regions within the p-type well region to isolate memory cells of the memory array section.

2. The method of claim 1, wherein the trench regions can be formed through the p-type well region and into the substrate layer without adversely affecting operation of the device.

3. A method of fabricating a multiple well structure for a dynamic random access memory device, comprising the steps of:

forming a first deep well relation of a first conductivity type into a substrate layer of a second conductivity type;

forming a first intermediate well region of the first conductivity type and a second intermediate well region of the second conductivity type within said first deep well region to establish an input/output section for the device, the second intermediate well region of the input/output section operating from a first substrate bias voltage;

forming a third intermediate well region of the first conductivity type and a fourth intermediate well region of the second conductivity type into the substrate layer to establish a peripheral transistor section for the device, the fourth intermediate well region of the peripheral transistor section operating from a second substrate bias voltage;

forming a second deep well region of the second conductivity type within the substrate layer;

forming a plurality of memory cells within the second deep well region to form a memory array section for the device, the memory array section operating from a third substrate bias voltage; and forming trench regions within the second deep well region of the memory array section to isolate the memory cells the trench region capable of extending through the second deep well region and into the substrate layer without adversely affecting operation of the device.

4. A method for fabricating a multiple well structure in which transistors for a dynamic random access memory can be formed, the fabrication method comprising the steps of:

forming a first well structure in a p substrate in which an input/output section can be formed, the first well structure having a deep n well with a shallow p well and a shallow n well formed therein, the shallow p well of said first well structure operating from a first substrate bias voltage;

forming a second well structure in the p substrate in which peripheral transistors can be formed, the second well structure having a deep n well with a shallow p well and a shallow n well formed in the deep n well, the shallow p well of said second well structure operating from a second substrate bias voltage;

forming a third well structure in the p substrate in which memory array transistors can be formed into memory cells of a memory array, the third well structure having a deep p well formed in the substrate, the p well of said third well structure operating from a third substrate bias voltage; and forming trench regions within the deep p well to isolate memory cells of the memory array from one another.

* * * * *